United States Patent
Nakamura et al.

(10) Patent No.: US 10,032,948 B2
(45) Date of Patent: Jul. 24, 2018

(54) SOLAR BATTERY MODULE

(71) Applicant: PANASONIC INTELLECTUAL PROPERTY MANAGEMENT CO., LTD., Osaka-shi, Osaka (JP)

(72) Inventors: Kei Nakamura, Osaka (JP); Isao Hasegawa, Osaka (JP)

(73) Assignee: PANASONIC INTELLECTUAL PROPERTY MANAGEMENT CO., LTD., Osaka-shi (JP)

( * ) Notice: Subject to any disclaimer, the term of this patent is extended or adjusted under 35 U.S.C. 154(b) by 0 days.

(21) Appl. No.: 15/438,886

(22) Filed: Feb. 22, 2017

(65) Prior Publication Data

US 2017/0179322 A1  Jun. 22, 2017

Related U.S. Application Data

(63) Continuation of application No. PCT/JP2015/004263, filed on Aug. 25, 2015.

(30) Foreign Application Priority Data

Aug. 28, 2014 (JP) .................... 2014-174172

(51) Int. Cl.
*H01L 31/056* (2014.01)
*H01L 31/0232* (2014.01)
(Continued)

(52) U.S. Cl.
CPC ...... *H01L 31/056* (2014.12); *H01L 31/02327* (2013.01); *H01L 31/0504* (2013.01); *H01L 31/02013* (2013.01); *H01L 31/0508* (2013.01)

(58) Field of Classification Search
CPC ............. H01L 31/0508; H01L 31/0475; H01L 31/02013; H01L 31/056; H01L 31/02327; H01L 31/0504
See application file for complete search history.

(56) References Cited

U.S. PATENT DOCUMENTS

| 6,410,843 B1 | 6/2002 | Kishi et al. |
| 2010/0147363 A1 | 6/2010 | Huang et al. |

(Continued)

FOREIGN PATENT DOCUMENTS

| JP | 2001-148500 A | 5/2001 |
| JP | 2014-27155 A | 2/2014 |

(Continued)

OTHER PUBLICATIONS

International Search Report dated Oct. 27, 2015, issued in counterpart International Application No. PCT/JP2015/004263 (1 page).

(Continued)

*Primary Examiner* — Matthew T Martin
(74) *Attorney, Agent, or Firm* — Westerman, Hattori, Daniels & Adrian, LLP

(57) ABSTRACT

A solar battery module is provided with a plurality of solar cells, a wiring material for connecting adjacent solar cells in the longitudinal directors to form strings, and a reflective body disposed on the rear-surface side of the solar cells, said body reflecting at least some incident light toward the solar cells. In the solar battery module, the strings are multiply disposed in the horizontal direction to constitute string groups, intervals $D_{20}$ between adjacent strings being formed wider in the longitudinal center section of the string groups than in the longitudinal end sections.

6 Claims, 2 Drawing Sheets

(51) Int. Cl.
*H01L 31/05* (2014.01)
*H01L 31/02* (2006.01)

(56) References Cited

U.S. PATENT DOCUMENTS

| | | | |
|---|---|---|---|
| 2011/0140106 A1* | 6/2011 | Forbes | H01L 31/0236 257/53 |
| 2014/0130848 A1* | 5/2014 | Takechi | H01L 31/048 136/251 |
| 2015/0114464 A1 | 4/2015 | Ishiguro et al. | |
| 2015/0303337 A1 | 10/2015 | Ishii et al. | |

FOREIGN PATENT DOCUMENTS

| | | |
|---|---|---|
| WO | 2014/033802 A1 | 3/2014 |
| WO | 2014/109281 A1 | 7/2014 |

OTHER PUBLICATIONS

Extended (supplementary) European Search Report dated Jul. 12, 2017, issued in counterpart European Application No. 15836474.5. (5 pages).

* cited by examiner

SOLAR BATTERY MODULE

CROSS-REFERENCE TO RELATED APPLICATION

The present application is a continuation under 35 U.S.C. § 120 of PCT/JP2015/004263, filed Aug. 25, 2015, which is incorporated herein by reference and which claimed priority to Japanese Patent Application No. 2014-174172 filed Aug. 28, 2014. The present application likewise claims priority under 35 U.S.C. § 119 to Japanese Patent Application No. 2014-174172 filed Aug. 28, 2014, the entire content of which is also incorporated herein by reference.

TECHNICAL FIELD

The present disclosure relates to a solar cell module.

BACKGROUND

A solar cell module is known in which a reflective member which reflects at least some of incident light are placed on a back surface side of a solar cell (for example, refer to Patent Literature 1). In such a solar cell module, incident light which passes through a portion where the solar cell is not provided to the back side can be reflected to the side of the cell, thus improving the usage efficiency of the incident light. In the solar cell module of the related art, a plurality of strings of solar cells are placed in an aligned manner with a constant spacing, to form a group of strings.

CITATION LIST

Patent Literature

Patent Literature 1: JP 2014-027155 A

In a solar cell module of the related art, normally, a spacing between an end of the module and a solar cell positioned at an end of the group of strings is wider than a spacing between adjacent strings. That is, when the above-described reflective member is provided, an exposure area of the reflective member (exposure area viewed from a light receiving surface side) is small at a periphery of the solar cell positioned at a central portion of the module, and the exposure area of the reflective member at a periphery of a solar cell positioned near the end of the module is large. Because of this, in the solar cell positioned at the central portion of the module, the amount of incident light is smaller compared to that of the solar cell positioned near the end of the module, resulting in reduction of, for example, short-circuit current (Isc) and a possible increase in the possibility of occurrence of hot spots.

According to one aspect of the present disclosure, there is provided a solar cell module comprising: a plurality of solar cells; a wiring member that connects adjacent solar cells to each other in a longitudinal direction to form a string; and a reflective member that is placed on a back surface side of the solar cell and that reflects at least a part of incident light to a side of the solar cell, wherein a plurality of the strings are placed in a lateral direction to form a group of strings, and a spacing between adjacent strings is formed wider at a central portion of the group of strings in the longitudinal direction than at ends in the longitudinal direction.

According to a solar cell module of an aspect of the present disclosure, a difference in the amount of incident light for the solar cells can be reduced, and, for example, Isc can be made more uniform.

DESCRIPTION OF EMBODIMENTS

Figure 1:
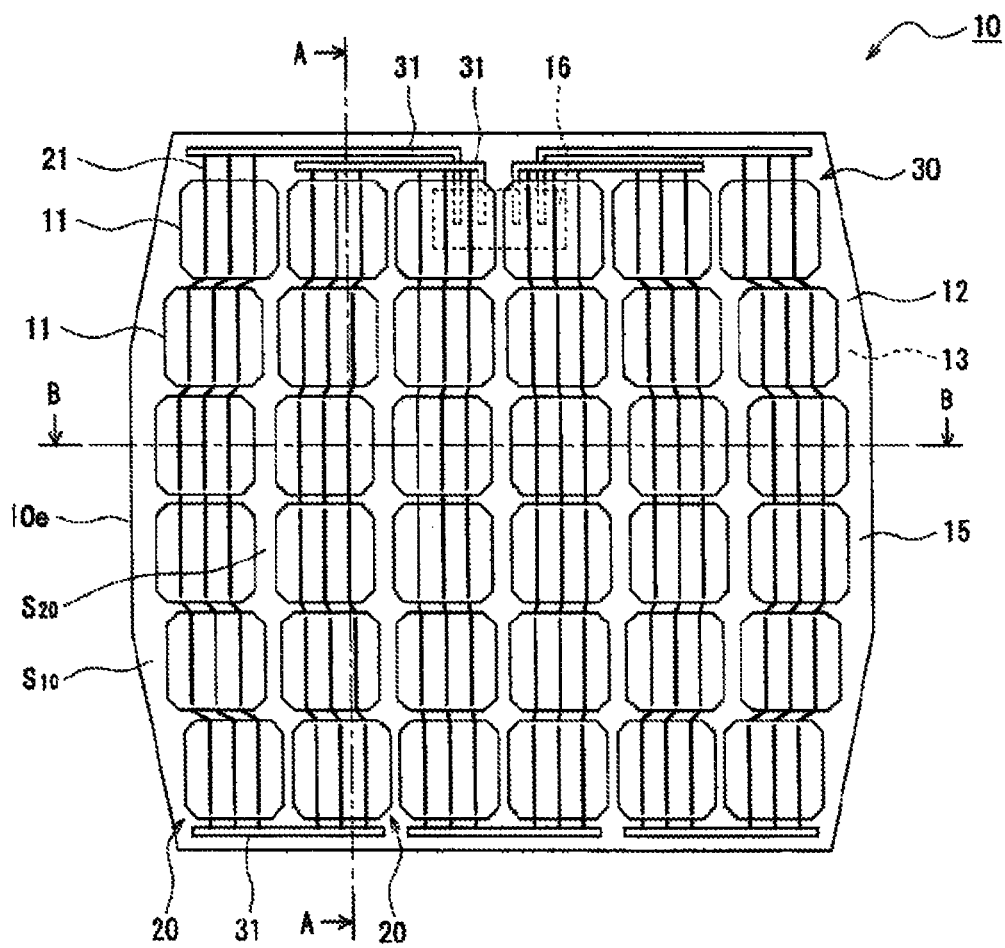
FIG. 1 is a plan view of a solar cell module according to a first embodiment of the present disclosure, viewed from a light receiving surface side.

Examples of embodiments of the present disclosure will now be described in detail with reference to the drawings.

The drawings referred to in the embodiments are schematically drawn, and the size, ratio, or the like of the constituent elements drawn in the drawings may differ from the actual structure. The specific size, ratio, or the like should be determined in consideration of the following description.

In the present specification, a term "longitudinal direction" and a term "lateral direction" are used as terms indicating directions. The longitudinal direction refers to a direction along which the solar cells of the string are arranged. The lateral direction refers to a direction orthogonal to the longitudinal direction, and is a direction along which the strings of the group of strings are arranged. Further, a description "providing a second member over a first member" is not intended to mean only the case where the first and second members are provided in direct contact with each other, unless otherwise specified. That is, such a description includes a case where another member exists between the first and second members.

In the following, a surface in a solar cell module where the solar light is primarily incident (exceeding 50% and up to 100%) is referred to as a "light receiving surface", and a surface opposite to the light receiving surface is referred to as a "back surface". The terms of the light receiving surface and the back surface are also used for constituent elements of the solar cell or the like.

First Embodiment

A solar cell module 10 according to a first embodiment of the present disclosure will now be described in detail with reference to FIGS. 1~3.

Figure 2:
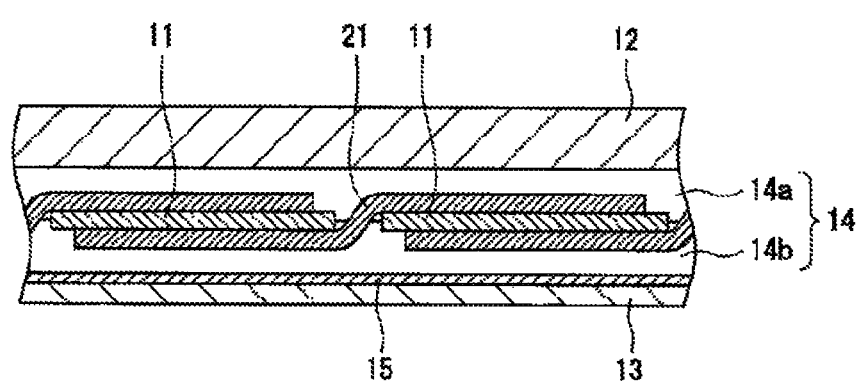
FIG. 2 is a diagram showing a part of a cross section along an AA line in FIG. 1.
Figure 3:
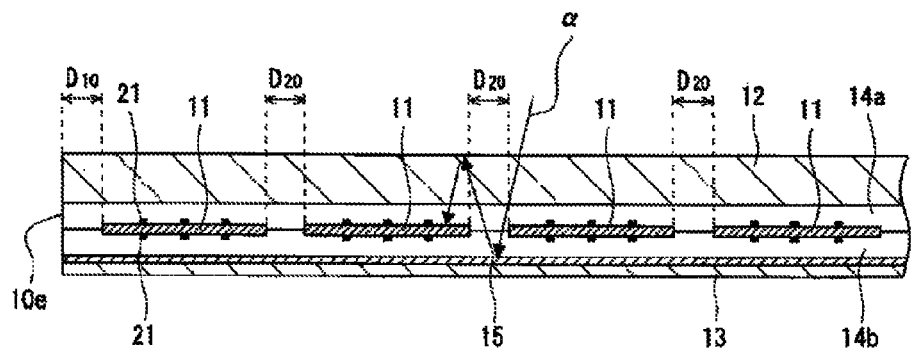
FIG. 3 is a diagram showing a part of a cross section along a BB line in FIG. 1.

As shown in FIGS. 1~3, the solar cell module 10 composes a plurality of solar cells 11, a first protection component 12 provided on a side of a light receiving surface of the solar cell 11, and a second protection component 13 provided on a side of a back, surface of the solar cell 11. The plurality of solar cells 11 are sandwiched and held between the last protection component 12 and the second protection component 13, and are sealed by an encapsulant 14 (refer to FIG. 3) filled between the protection components. The solar cell module 10 additionally comprises a reflective member 15 provided at a back surface side of the solar cell 11 and which reflects at least a part of the incident light to a side of the solar cell 11.

The solar cell module 10 comprises a wiring member 21 which connects adjacent solar cells 11 in the longitudinal direction to form a string 20. The string 20 is a structure in which a plurality of solar cells 11 are arranged in one line, and a plurality of the strings 20 are provided along the lateral direction. The wiring member 21 is, for example, bent in a thickness direction of the module between adjacent solar cells 11, and is attached using adhesive or the like to an electrode on the light receiving surface side of one solar cell 11 and to an electrode on the back surface side of the other solar cell 11 (refer to FIG. 2).

The solar cell module 10 comprises a group of strings 30 in each of which a plurality of strings 20 are placed in the lateral direction. In the present embodiment, the group of strings 30 includes six rows of strings arranged in the lateral direction. The group of strings 30 desirably has a bridging wiring member 31 which connects adjacent strings 20 in the lateral direction. At least a part of the bridging wiring member 31 extends into a terminal box 16 provided on the back side of the second protection component 13, for example. In the terminal box 16, a bypass diode for stabilizing the output is desirably built in.

The solar cell 11 comprises a photoelectric conversion unit which produces carriers upon receiving solar light. The photoelectric conversion unit has, as electrodes for collecting the produced carriers, a light receiving surface electrode formed over the light receiving surface of the photoelectric conversion unit and a back surface electrode formed over the back surface, for example (both of which are not shown in the figures). The wiring members 21 are connected to the electrodes. However, the structure of the solar cell 11 is not limited to this structure, and the structure may be, for example, a structure in which the electrode is formed only over the back surface of the photoelectric conversion unit. Desirably, the back surface electrode is formed in a larger area than the light receiving surface electrode, and a surface having a larger electrode area (or a surface on which the electrodes are formed) may be considered as the back surface of the solar cell 11.

The photoelectric conversion unit comprises a semiconductor substrate made of, for example, crystalline silicon (c-Si), gallium arsenide (GaAs), indium phosphide (InP), or the like, an amorphous semiconductor layer formed over the semiconductor substrate; and a transparent conductive layer formed over the amorphous semiconductor layer. As a specific example, a structure may be employed in which an i-type amorphous silicon layer, a p-type amorphous silicon layer, and a transparent conductive layer are sequentially formed over one surface of an n-type monocrystalline silicon substrate, and an i-type amorphous silicon layer, an n-type amorphous silicon layer, and a transparent conductive layer are sequentially formed over the other surface. The transparent conductive layer is desirably formed from a transparent conductive oxide in which a metal oxide such as indium oxide ($In_2O_3$) and zinc oxide (ZnO) is doped with Sn, Sb, or the like.

For the first protection component 12 and the second protection component 13, for example, a glass substrate, a resin subs tore, a resin film, or the like may be employed. For the first protection component 12, a member having a light transmissive characteristic is used, and from the viewpoint of heat sensitivity and endurance, a glass substrate is desirably used. A thickness of the glass substrate is, for example about 2~6 mm. For the second protection component 13, a transparent member may be used or a non-transparent member may be used. For the second protection component 13, for example, a resin film is used. A thickness of the resin film is, for example, about 50~300 µm.

The encapsulant 14 has a function to fill a gap between the solar cell 11 and the protection components, to seal the solar cell 11. The encapsulate 14 desirably has, as a primary constituent, a resin that can be applied in a lamination process to be described below. As the resin, ethylene vinyl acetate copolymer (EVA), polyvinylbutyral (PVB), or the like can be exemplified. The encapsulant 14 desirably includes an encapsulant 14a placed between the solar cell 11 and the first protection component 12, and an encapsulant 14b placed between the solar cell 11 and the second protection component 13.

The reflective member 15 has a function to reflect, of the light incident from the light receiving surface side of the solar cell module 10, at least a part of light passing through a portion where the solar cell 11 is not placed to the back side to the light receiving surface side, and to thereby improve the usage efficiency of the incident light (refer to light α in FIG. 3). A part of the light reflected by the reflective member 15 is, for example, again reflected at an interface of the first protection component 12 or the like and is incident on the solar cell 11. Alternatively, the reflected light is directly incident on the solar cell 11. In the present embodiment, at a portion where the solar cell 11 is not placed when the solar cell module 10 is viewed from the light receiving surface side, the reflecting member 15 or the bridging wiring member 31 exists. The bridging wiring member 31 normally reflects at least a part of the incident light, and a part of the reflected light is incident on the solar cell 11.

The reflective member 15 desirably has a reflectivity of 10% or more for at least a part of light of a wavelength of 380~2000 nm, and particularly desirably has a high reflectivity for visible light (having a wavelength of 380~780 nm), and in particular, light of a wavelength of 500~600 nm. The visible light reflectivity of the reflective member 15 is desirably greater than or equal to 50%, and more desirably greater than or equal to 60%, and even more desirably greater than or equal to 70%. The reflection of the visible light by the reflective member 15 may be either diffused reflection or regular reflection, and the reflectivity described above refers to a total reflectivity.

The reflective member 15 is provided on the back surface side of the solar cell 11, at least at a portion corresponding to a region between a plurality of adjacent solar cells 11 (gap $S_{20}$), and at a portion corresponding to a region between an end 10e of the solar cell module 10 and the solar cell 11 positioned at the end of the group of strings 30 (gap $S_{10}$). With this configuration, when the solar cell module 10 is viewed from the light receiving surface side, the reflective member 15 is exposed at the periphery of the solar cell 11. In the present embodiment, the reflective member 15 is provided between the encapsulant 14b and the second protection component 13. Alternatively a light reflecting material to be described later may be contained in the resin forming at least one of the second protection component 13 and the encapsulant 14b, to form the reflective member 15.

The reflective member 15 is desirably provided at approximately the entire region over the second protection component 13 including portion covered with the solar cell 11. The reflective member 15 has, for example, a layer structure which a material which reflects at least a part of the incident light (hereinafter referred to as "light reflective material") is dispersed in a resin coating. The reflective member 15 having the layer structure can be provided by applying a printing ink containing the light reflective material over the second protection component 13. Alternatively, the reflective member 15 may be a metal layer such as silver, copper, nickel, aluminum, or the like. Of these, aluminum is particularly desirable.

As the light reflective material, a white pigment such as antimony trioxide, zirconium oxide, zinc sulfide, zinc oxide, titanium oxide, barium sulfide, aluminum oxide, or the like is desirably used. Of these materials, the zinc oxide and titanium oxide are particularly desirable. For the light reflective material, in consideration of the design of the solar cell module 10, a colored pigment other than the white pigment (for example, a black pigment) may be used. Alternatively, the reflective member 15 may have a layered structure containing, from the side of the light receiving surface, a layer containing a colored pigment, for example, having a high transmittance for infrared light (for example, a black pigment such as perylene black) and a layer containing the above-described white pigment.

A shape of the solar cell module 10 viewed from the light receiving surface side, in particular, a shape of the group of strings 30, will be described in detail.

As shown in FIG. 1, the solar cell module 10 may have an octagonal shape in the plan view. The shape of the solar cell module 10 is not particularly limited, and may be a quadrangular shape, a pentagonal shape, a hexagonal shape (refer to FIG. 4 to be described later), an elliptical shape, or the like. The shape of the solar cell module 10 in the plan view is determined, for example, by the shape of the first protection component 12 (glass substrate) in the plan view. In any shape, desirably, a predetermined gap $S_{10}$ is provided between the end 10e of the solar cell module 10 and the solar cell 11 positioned at the end of the group of strings 30, from the viewpoint of safety or the like.

The group of strings 30 is formed such that a spacing $D_{20}$ (gap $S_{20}$) between adjacent strings 20 is wider at a central portion of the group of strings 30 in the longitudinal direction than at the ends in the longitudinal direction. That is, an area of the reflective member 15 exposed from the gap $S_{20}$ of each string 20 when the solar cell module 10 is viewed from the light receiving surface side is wider at the central portion of the group of strings 30 in the longitudinal direction than at the ends in the longitudinal direction. By changing the spacing $D_{20}$ in this manner, it becomes possible to red ice a difference in the exposed area of the reflective member 15 at the periphery of the solar cells 11, between the solar cells 11 positioned at the ends of the group of strings 30 in the longitudinal direction and the solar cells 11 positioned at the central portion in the longitudinal direction. In this manner, for example, a difference in the amount of incident light with respect to the solar cells 11 can be reduced. The portion in which the bridging wiring member 31 is provided also has a light reflecting function similar to, for example, the exposed portion of the reflective member 15.

The spacing $D_{20}$ is desirably formed to be wider from the ends of the group of strings 30 in the longitudinal direction toward the central portion in the longitudinal direction. In other words, the spacing $D_{20}$ is desirably gradually widened from the ends of the group of strings 30 in the longitudinal direction toward the central portion in the longitudinal direction without a sudden enlargement at the central portion of the group of strings 30 in the longitudinal direction. With such a configuration, for example, the difference in the amount of incident light with respect to the solar cells 11 can be further reduced.

In the present embodiment, the strings 20 placed on one side of the group of strings 30 in the lateral direction are configured such that the central portion in a long-side direction protrudes toward the one side in the lateral direction. On the other hand, the strings 20 placed on the other side of the group of strings 30 in the lateral direction are configured such that the central portion in the long-side direction protrudes toward the other side in the lateral direction. In the group of strings 30, the central portion in the longitudinal direction expands and protrudes on both sides in the lateral direction. The degree of protrusion may be set larger for strings 20 closer to the ends of the group of strings 30 in the lateral direction, and smaller for strings closer to the central portion in the lateral direction.

As shown in FIG. 3, desirably, a difference between a spacing $D_{10}$ between the end 10e of the solar cell module 10 and the solar cell 11 positioned at the end of the group of strings 30, and the spacing $D_{20}$, is small.

Each string 20 of the group of strings 30 is formed by connecting the adjacent solar cells 11, for example, while slightly shifting the wiring member 21 in the lateral direction instead of placing the wiring member 21 straight in the longitudinal direction, so that the spacing $D_{20}$ is wider at the central portion in the longitudinal direction than at the ends in the longitudinal direction. Alternatively, the wiring member 21 may be bent in the lateral direction in a region between the adjacent solar cells 11, to vary the spacing $D_{20}$.

The solar cell module 10 having the above-described structure can be manufactured by laminating the group of strings 30 using the first protection component 12, the second protection component 13, and resin sheets forming the encapsulates 14a and 14b. The group of strings 30 is formed by connecting a plurality of strings 20 in the lateral direction using bridging wiring members 31. As described above, each string 20 is formed by connecting the adjacent solar cells 11 while shifting the wiring member 21 slightly in the lateral direction instead of placing the wiring member 21 straight in the longitudinal direction, for example. In a laminating device, the first protection component 12, a resin sheet forming the encapsulant 14a, the group of strings 30, a resin sheet forming the encapsulate 14b, and the second protection component 13 are layered in sequence over a heater. The layered structure is heated, for example, to a temperature at which the resin sheets forming the encapsulates 14a and 14b are softened under a vacuum state. Then, the heating is continued while the constituent members are pressed toward the heater side under an atmospheric pressure, to laminate the members, and to consequently obtain the solar-cell module 10.

As described, according to the solar cell module 10 having the above-described structure, the difference in the exposed area of the reflective member 15 (area of a portion where the solar cell 11 does not exist) at the periphery of the solar cells 11 of the group of strings 30 can be reduced. With such a configuration, the difference in the amount of incident light with respect to the solar cells 11 can be reduced, and consequently, for example, Isc can be made more uniform and the probability of occurrence of hot spots can be reduced.

Second Embodiment

A solar cell module 50 according to a second embodiment of the present disclosure will now be described in detail with reference to FIG. 4. In the following, constituent elements similar to those in the above-described embodiment are assigned the same reference numerals and will not be described again.

Figure 4:
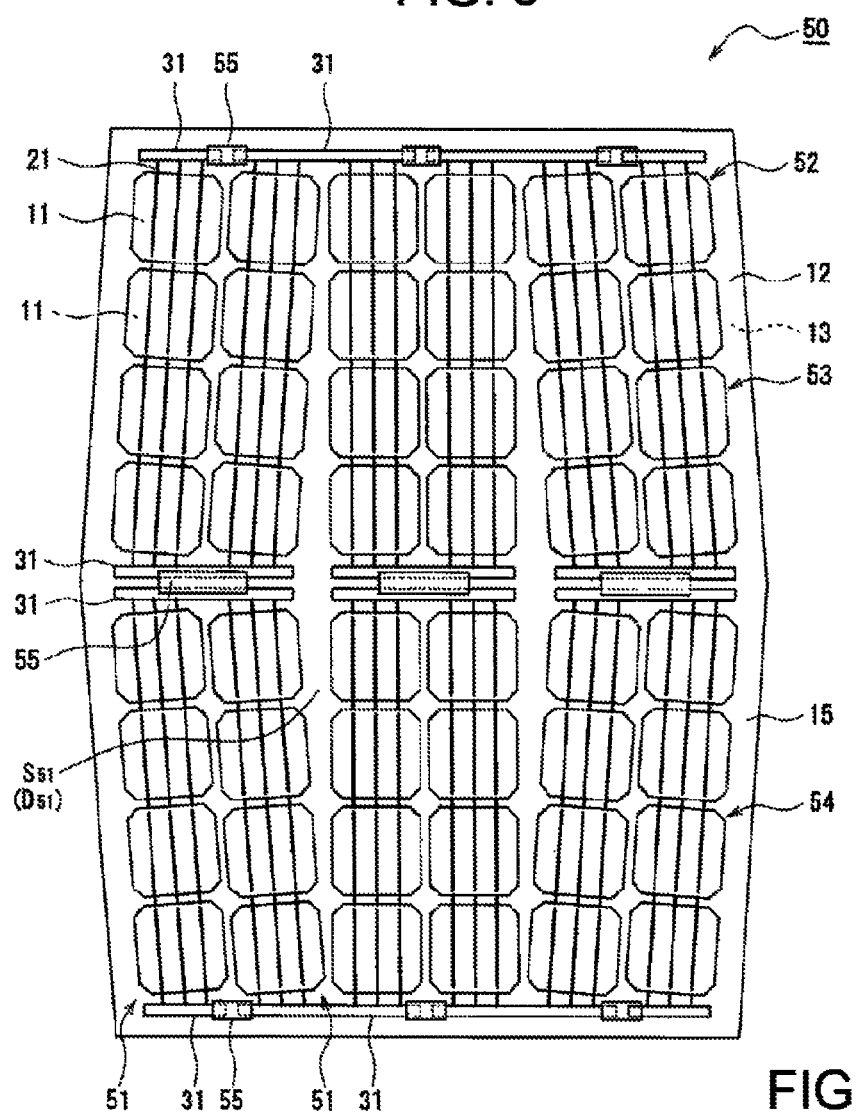
FIG. 4 is a plan view of a solar cell module according to a second embodiment of the present disclosure, viewed from a light receiving surface side.

As shown in FIG. 4, the solar cell module 50 differs from the solar cell module 10 in that a group of strings 52 is divided into a plurality of blocks 53 and 54 arranged along the longitudinal direction. In the present embodiment, the group of strings 52 is divided into two at the central portion in the longitudinal direction, and the numbers of solar cells 11 forming the strings 51 of the blocks 53 and 54 are equal to each other (for example, 4 solar cells 11). Desirably, the bridging wiring member 31 is respectively provided at the sides in the longitudinal direction of the blocks 53 and 54. In FIG. 4, the description of the terminal box is omitted, but in the solar cell module 50 also, for example, a part of the bridging wiring members 31 extends into the terminal box. The blocks 53 and 54 are electrically connected to each other by, for example, a cable provided at the back side of the second protection component 13 or the like.

In the example configuration shown in FIG. 4, the bridging wiring members 31 placed adjacent to each other in the longitudinal direction between the blocks 53 and 54 are fixed using an adhesion tape 55. In addition, the bridging wiring members 31 placed adjacent to each other in the lateral direction are also fixed using the adhesion tape 55. The strings 51 of the blocks are connected in the longitudinal direction to form a pair of two rows via the bridging wiring members 31 placed adjacent to each other in the longitudinal direction between the blocks and the adhesion tape 55.

In the case of the group of strings 52 also, the gap $S_{51}$ (spacing $D_{51}$) between the adjacent stings 51 is formed wider at a central portion of the group of strings 52 in the longitudinal direction than at ends in the longitudinal direction. In the present embodiment, the group of strings 52 is divided into the blocks 53 and 54 at the central portion in the longitudinal direction, and the spacing $D_{51}$ is formed to be wider from the ends of the group of strings 52 in the longitudinal direction toward a boundary position of the blocks (central portion of the group of strings 52 in the longitudinal direction). More specifically, the spacing between the pair of the strings 51 connected in the longitudinal direction via the bridging wiring member 31 and the adhesion tape 55 is widened toward the central portion of the group of strings 52 in the longitudinal direction.

In the solar cell module 50, similar to the solar cell module 10, the difference of the exposed id ea of the reflective member 15 at the periphery of the solar cells 11 of the group of strings 52 can be reduced. In addition, because the group of strings 52 is divided into the plurality of blocks 53 and 54, the amount of reflection of light is increased at the boundary position of the blocks, and the amount of incident light for the solar cell 11 placed near the boundary position can be further increased. Alternatively, the numbers, the lengths or the like of the strings 51 may differ among the blocks. In addition, the number of blocks is not limited to two, and may be three or more.

REFERENCE SIGNS LIST 10, 50 SOLAR CELL MODULE; 10e END; 11 SOLAR CELL; 12 FIRST PROTECTION COMPONENT; 13 SECOND PROTECTION COMPONENT; 14 ENCAPSULANT; 15 REFLECTIVE MEMBER; 16 TERMINAL BOX; 20, 51 STRING; 21 WIRING MEMBER; 30, 52 GROUP OF STRINGS; 31 BRIDGING WIRING MEMBER; 53, 54 BLOCK; 55 ADHESION TAPE; $S_{10}$, $S_{20}$, $S_{51}$ GAP; $D_{10}$, $D_{20}$, $D_{51}$ SPACING.

The invention claimed is:

1. A solar cell module comprising:
   a plurality of solar cells;
   a wiring member that connects adjacent solar cells of the plurality of solar cells to each other in a longitudinal direction to form a string; and
   a reflective member that is placed on a back surface side of the plurality of solar cells and that reflects at least a part of incident light to the plurality of solar cells,
   a first protection component on an incident light surface side of the plurality of solar cells,
   a second protection component on the back surface side of the plurality of solar cells,
   a first encapsulant that fills a gap between the plurality of solar cells and the first protection components,
   a second encapsulant that fills a gap between the plurality of solar cells and the second protection components and contains a light reflecting material that reflects at least a part of visible light,
   wherein
   a plurality of the strings are placed in a lateral direction to form a group of strings, and
   spacing between adjacent strings is formed wider at a central portion of the group of strings in the longitudinal direction than at least at one end in the longitudinal direction, and
   an entirety of the spacing between adjacent strings at the center portion and the at least one end portion is filled with the first encapsulant on the incident light surface side of the plurality of solar cells and the second encapsulant on the back surface side of the plurality of solar cells.

2. The solar cell module according to claim 1, wherein the spacing between adjacent strings at a portion between the center portion and the at least one end of the group of strings in the longitudinal direction is formed wider than spacing between adjacent strings at ends of the group of strings in the longitudinal direction and formed smaller than that of between adjacent strings at the center of the group of strings in the longitudinal direction.

3. The solar cell module according to claim 2, wherein each of the strings placed on one side of the group of strings in the lateral direction is formed such that a central portion in the longitudinal direction protrudes toward the one side in the lateral direction, and
each of the strings placed on the other side of the group of strings in the lateral direction is formed such that a central portion in the longitudinal direction protrudes to the other side in the lateral direction.

4. The solar cell module according to claim 1, wherein the group of strings is divided into a plurality of blocks in the longitudinal direction,
and
the spacing between adjacent strings at the center of the group of strings in the longitudinal direction is formed wider than the spacing between the adjacent strings at ends of the group of strings in the longitudinal direction,
and the ends of the group of strings are positioned at an outer boundary position of the module.

5. The solar cell module according to claim 4, wherein at least two groups of strings of said plurality of strings are adjacent in the lateral direction and are connected to a second wiring member at the center of the group of strings in the longitudinal direction by way of the wiring member in an area where the plurality of solar cells are not placed.

6. The solar cell module according to claim 5, further comprising
at least two second wiring members adjacent to each other in the longitudinal direction and the at least two second wiring members are fixed by an adhesive tape to each other in the area where the plurality of solar cells are not placed.

* * * * *